United States Patent
Masuda (12)

(10) Patent No.: US 11,993,083 B2
(45) Date of Patent: May 28, 2024

(54) ACTUATOR, LIQUID DISCHARGE HEAD, AND LIQUID DISCHARGE APPARATUS

(71) Applicant: Toshiaki Masuda, Kanagawa (JP)

(72) Inventor: Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/480,155

(22) Filed: Sep. 21, 2021

(65) Prior Publication Data

US 2022/0097373 A1 Mar. 31, 2022

(30) Foreign Application Priority Data

Sep. 30, 2020 (JP) ................................ 2020-165230

(51) Int. Cl.
*B41J 2/14* (2006.01)

(52) U.S. Cl.
CPC ................................ *B41J 2/14233* (2013.01)

(58) Field of Classification Search
None
See application file for complete search history.

(56) References Cited

U.S. PATENT DOCUMENTS

| | | | |
|---|---|---|---|
| 2003/0218644 A1* | 11/2003 | Higuchi | H10N 30/079 257/E27.104 |
| 2004/0051763 A1 | 3/2004 | Matsubara et al. | |
| 2014/0267509 A1 | 9/2014 | Shinkai et al. | |
| 2015/0022592 A1 | 1/2015 | Aoyama et al. | |
| 2015/0054888 A1 | 2/2015 | Sakai et al. | |
| 2015/0070444 A1 | 3/2015 | Ishimori et al. | |
| 2015/0171307 A1 | 6/2015 | Masuda et al. | |
| 2015/0214465 A1* | 7/2015 | Mawatari | B41J 2/14233 347/68 |
| 2016/0001556 A1 | 1/2016 | Masuda et al. | |
| 2017/0100934 A1 | 4/2017 | Masuda et al. | |
| 2017/0253040 A1 | 9/2017 | Shinkai et al. | |

(Continued)

FOREIGN PATENT DOCUMENTS

| | | |
|---|---|---|
| CN | 101541540 A | 9/2009 |
| EP | 0 691 693 A1 | 1/1996 |

(Continued)

OTHER PUBLICATIONS

Extended European Search Report dated Feb. 3, 2022 in European Patent Application No. 21195972.1, 7 pages.

(Continued)

*Primary Examiner* — Erica S Lin
(74) *Attorney, Agent, or Firm* — XSENSUS LLP (57) ABSTRACT

An actuator includes a substrate, a diaphragm over the substrate, a lower electrode over the diaphragm, a lead titanate ($PbTiO_3$) layer over the lower electrode, a piezoelectric body over the $PbTiO_3$ layer, and an upper electrode over the piezoelectric body. The piezoelectric body comprises particles of lead zirconate titanate (PZT). An average diameter of the particles of the PZT is 40 nm or more. The average diameter is measured by capturing an electron backscatter diffraction image of the piezoelectric body in an image area of 20 μm×20 μm, fitting each of the particles in the image area, and determining an average value of diameters of the circles.

9 Claims, 4 Drawing Sheets

(56) References Cited

U.S. PATENT DOCUMENTS

| | | |
|---|---|---|
| 2018/0370237 A1 | 12/2018 | Mizukami et al. |
| 2019/0044055 A1 | 2/2019 | Kondo et al. |
| 2019/0270310 A1 | 9/2019 | Masuda et al. |
| 2020/0298570 A1 | 9/2020 | Masuda et al. |
| 2021/0039393 A1 | 2/2021 | Mizukami et al. |
| 2021/0162759 A1 | 6/2021 | Miwa et al. |
| 2021/0252862 A1 | 8/2021 | Masuda |

FOREIGN PATENT DOCUMENTS

| | | |
|---|---|---|
| JP | 10-050960 | 2/1998 |
| JP | 11-020156 | 1/1999 |
| JP | 2001-199798 | 7/2001 |
| JP | 2005-244174 | 9/2005 |
| JP | 2007-335779 | 12/2007 |
| JP | 2015-082541 | 4/2015 |
| JP | 2016-046335 | 4/2016 |
| JP | 2017-178642 | 10/2017 |
| JP | 2017-228760 A | 12/2017 |
| JP | 2019-029566 | 2/2019 |
| JP | 2019-041070 | 3/2019 |
| JP | 2019-052348 | 4/2019 |
| WO | WO2005/031886 A1 | 4/2005 |

OTHER PUBLICATIONS

Office Action dated Nov. 21, 2022 in Chinese Patent Application No. 202111090027.0, 6 pages.

* cited by examiner

FIG. 6

ACTUATOR, LIQUID DISCHARGE HEAD, AND LIQUID DISCHARGE APPARATUS

CROSS-REFERENCE TO RELATED APPLICATION

This patent application is based on and claims priority pursuant to 35 U.S.C. § 119(a) to Japanese Patent Application No. 2020-165230, filed on Sep. 30, 2020, in the Japan Patent Office, the entire disclosure of which is hereby incorporated by reference herein.

BACKGROUND

Technical Field

Aspects of the present disclosure relate to an actuator, a liquid discharge head, and a liquid discharge apparatus.

Description of the Related Art

As a liquid discharge apparatus, there is known, for example, an inkjet recording apparatus including a liquid discharge head that discharges liquid such as ink. For such a liquid discharge head, there are known technologies of using a piezoelectric body as a drive source of an actuator, and technologies of improving piezoelectric characteristics are proposed to obtain a high quality image or the like.

SUMMARY

Embodiments of the present disclosure describe an improved actuator that includes a substrate, a diaphragm over the substrate, a lower electrode over the diaphragm, a lead titanate ($PbTiO_3$) layer over the lower electrode, a piezoelectric body over the $PbTiO_3$ layer, and an upper electrode over the piezoelectric body. The piezoelectric body comprises particles of lead zirconate titanate (PZT). An average diameter of the particles of the PZT is 40 nm or more. The average diameter is measured by capturing an electron backscatter diffraction image of the piezoelectric body in an image area of 20 μm×20 μm, fitting each of the particles in the image area, and determining an average value of diameters of the circles.

BRIEF DESCRIPTION OF THE SEVERAL VIEWS OF THE DRAWINGS

A more complete appreciation of the disclosure and many of the attendant advantages thereof will be readily obtained as the same becomes better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted. In addition, identical or similar reference numerals designate identical or similar components throughout the several views.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

As used herein, the singular forms "a," "an," and "the" are intended to include the plural forms as well, unless the context clearly indicates otherwise.

Hereinafter, an actuator, a liquid discharge head, and a liquid discharge apparatus according to embodiments of the present disclosure is described with reference to the drawings. It is to be noted that the following embodiments are not limiting the present disclosure and any deletion, addition, modification, change, etc. can be made within a scope in which person skilled in the art can conceive including other embodiments, and any of which is included within the scope of the present disclosure as long as the effect and feature of the present disclosure are demonstrated.

An actuator according to the present embodiment includes a substrate, a diaphragm over the substrate, a lower electrode over the diaphragm, a lead titanate ($PbTiO_3$) layer over the lower electrode, a piezoelectric body over the $PbTiO_3$ layer, and an upper electrode over the piezoelectric body.

Figure 1:
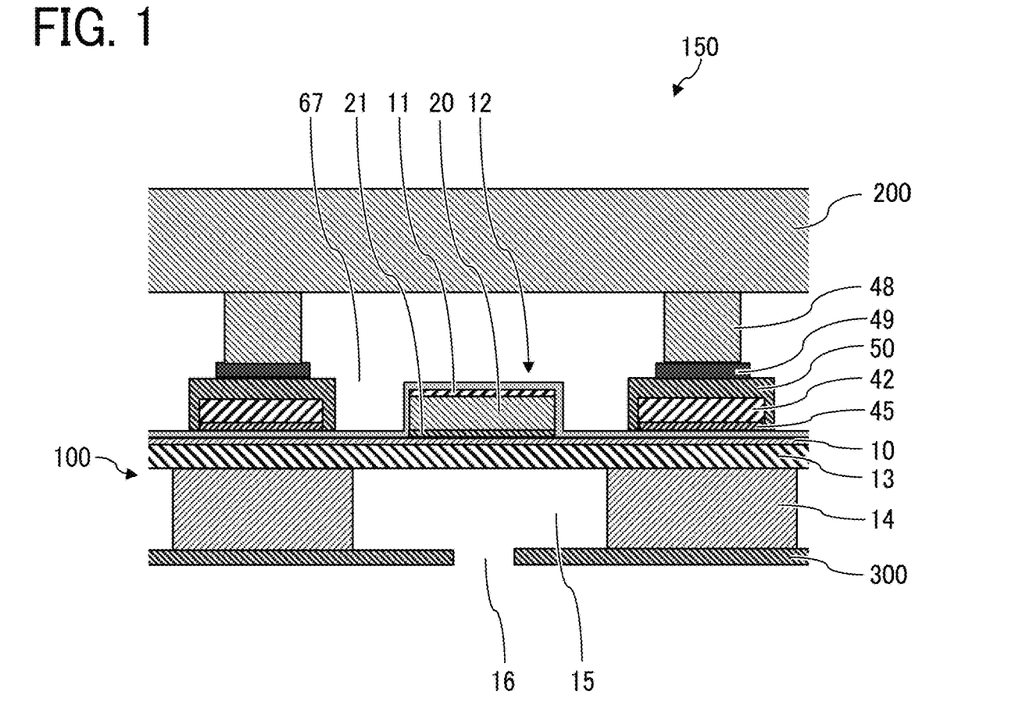
FIG. 1 is a schematic cross-sectional view illustrating a liquid discharge head according to embodiments of the present disclosure, taken along a short side of a liquid chamber.
Figure 2:
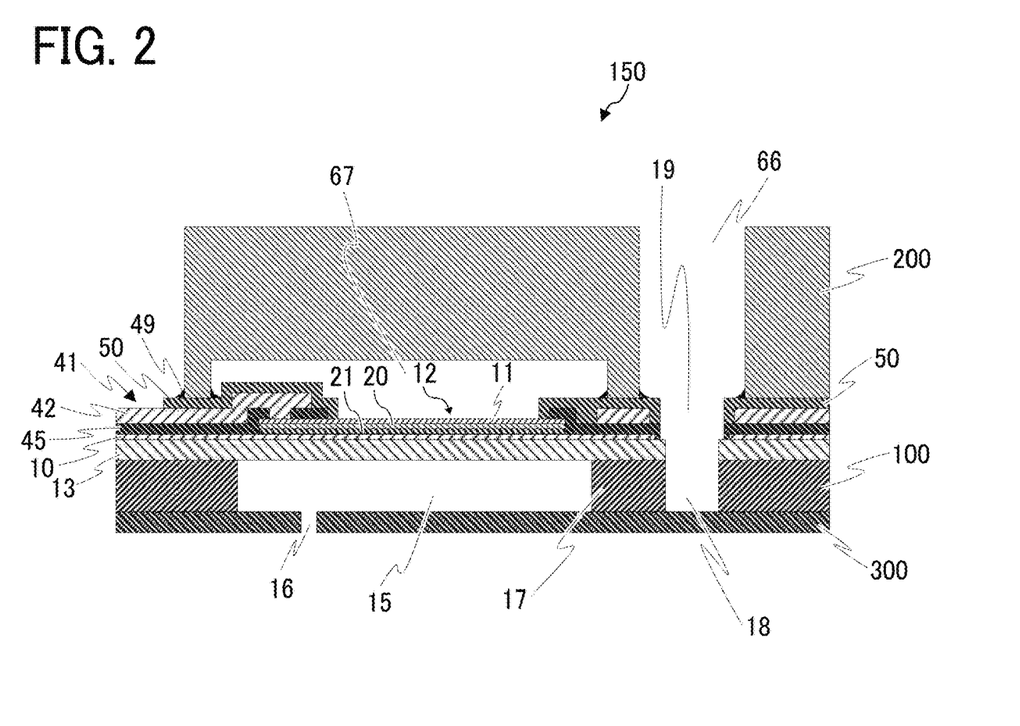
FIG. 2 is a schematic cross-sectional view illustrating the liquid discharge head according to embodiments of the present disclosure, taken along a long side of the liquid chamber.

FIG. 1 is a cross-sectional view of a liquid discharge head 150 including an actuator 12 (also referred to as a piezoelectric actuator or a piezoelectric element) according to the present embodiment along a short side of a liquid chamber. FIG. 2 is a cross-sectional view of the liquid discharge head 150 in FIG. 1 along a long side of the liquid chamber. As illustrated in FIGS. 1 and 2, the liquid discharge head 150 according to the present embodiment includes the actuator 12 to generate energy for discharging liquid and a diaphragm 13 over an actuator substrate 100 as a substrate. The liquid discharge head 150 further includes pressure-chamber partitions 14 and a pressure chamber 15. The pressure chamber 15 as a liquid chamber is defined by the pressure-chamber partitions 14.

A piezoelectric body 20 comprises particles of lead zirconate titanate (PZT) and is formed over a lead titanate ($PbTiO_3$) layer 21. The piezoelectric body 20 is sandwiched between a common electrode 10 and an individual electrode 11. A voltage is applied to the piezoelectric body 20 via a wiring layer 42 (also referred to as wiring, lead wiring, or the like) stacked on each electrode layer. In the present embodiment, the lower electrode is the common electrode 10 and the upper electrode is the individual electrode 11. However, the configuration is not limited thereto, and the lower electrode may be the individual electrode and the upper electrode may be the common electrode in another embodiment.

The actuator substrate 100 and a nozzle substrate 300 define the pressure chamber 15. The actuator substrate 100, a support substrate 200, and the nozzle substrate 300 are bonded to each other, thereby constructing the liquid discharge head 150.

In the liquid discharge head 150 having such a configuration, a controller applies a pulse voltage in a state in which each pressure chamber 15 is filled with liquid, for example, recording liquid (ink). The controller causes an oscillation circuit to apply the pulse voltage of, e.g., 20 V to the individual electrode 11 corresponding to a nozzle orifice (nozzle) 16 from which the recording liquid is to be discharged, via a connection hole in the wiring layer 42 and an interlayer insulating film 45 based on image data.

When the pulse voltage is applied, the piezoelectric body 20 contracts in a direction parallel to the diaphragm 13 due to an electrostrictive effect, and the diaphragm 13 bends toward the pressure chamber 15. As a result, the pressure in the pressure chamber 15 rapidly increases, and the recording liquid is discharged from the nozzle orifice 16 communicating with the pressure chamber 15.

After the application of the pulse voltage, the contracted piezoelectric body 20 returns to an original shape, so that the bent diaphragm 13 returns to an original position. As a result, the pressure in the pressure chamber 15 becomes negative as compared with the pressure in a common liquid chamber 18. The recording liquid (e.g., ink) supplied from the outside via a liquid supply port 66 is supplied from a common liquid supply passage 19 and the common liquid chamber 18 to the pressure chamber 15 via a fluid restrictor 17. Repeating such operation allows the liquid discharge head 150 to discharge liquid droplets continuously. Thus, an image is formed on a recording medium (e.g., a sheet of paper), which is placed so as to face the liquid discharge head 150.

Next, the actuator 12 according to the present embodiment is described in detail.

The piezoelectric body 20 according to the present embodiment comprises PZT, and the average diameter of particles of PZT obtained by the following measurement method is 40 nm or more.

In the measurement method, an Electron Backscatter Diffraction (EBSD) image of the piezoelectric body 20 is captured in an image area of 20 μm×20 μm, each of the particles in the image area is fitted to a circle (i.e., circle fitting), and an average value of diameters of the circles is determined as the average diameter of the particles of PZT.

In the present embodiment, the "particles of PZT (or PZT particles)" may be referred to as grains or crystal grains, and the "diameter of the PZT particles" may be referred to as a grain size of the crystal grains. Further, the "average diameter of the PZT particles" may be referred to as an average particle diameter of the piezoelectric body or simply an average particle diameter.

The average particle diameter of the piezoelectric body (average diameter of the particles of PZT) can be calculated from the distribution of the grain size of the crystal grains by mapping the surface of the piezoelectric body by an EBSD method. In the EBSD method, the crystal orientation and area of each grain of PZT in the piezoelectric body can be obtained.

Figure 3:
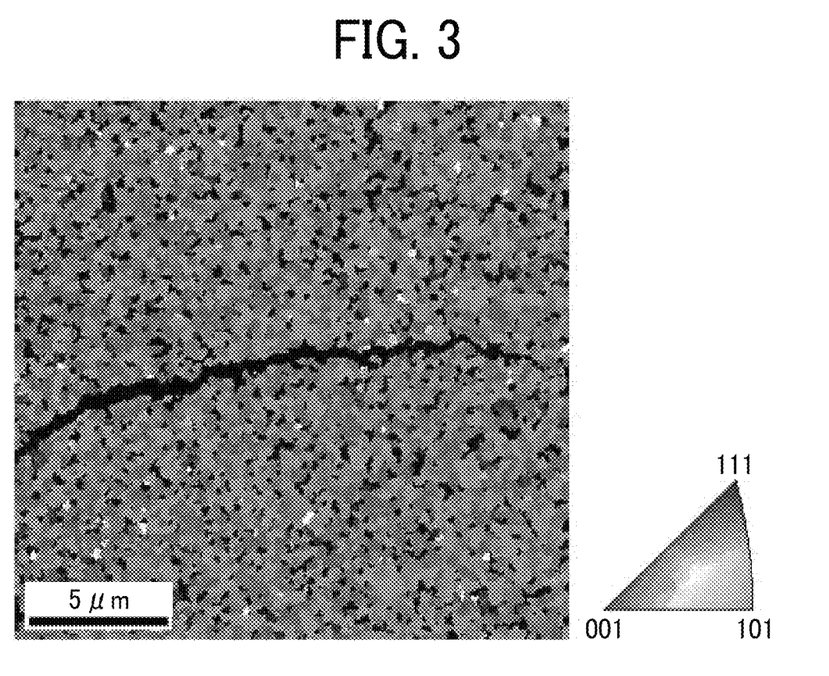
FIG. 3 is a diagram illustrating an example of a result of Electron Backscatter Diffraction (EBSD) measurement performed on a piezoelectric body.

FIG. 3 is a diagram illustrating an example of a measurement image of the surface of the piezoelectric body according to the present embodiment, obtained by the EBSD method. The orientation of each grain can be measured, and at the same time, the grain boundary of each grain can be clarified by the EBSD method. Therefore, the EBSD method is effective for grasping the grain diameter (the grain size of the crystal grain). In the present embodiment, an EBSD image of the piezoelectric body is captured in an image area of 20 μm×20 μm, each of the particles (grains) in the image area is fitted to a circle (i.e., circle fitting), and an average value of diameters of the circles is determined as the average diameter of the PZT particles.

Next, a relation between the average particle diameter of the piezoelectric body and a layer thickness (also referred to as a film thickness) of the $PbTiO_3$ layer is described. In the present embodiment, preferably, the $PbTiO_3$ layer is formed over the lower electrode and the piezoelectric body is formed over the $PbTiO_3$ layer. By forming the $PbTiO_3$ layer, the crystal orientation of PZT can be controlled. The $PbTiO_3$ layer may be a $PbTiO_3$ film.

Table 1 below illustrates an example of the relation between the thickness of the $PbTiO_3$ layer and the average particle diameter of the piezoelectric body (Embodiments 1 to 5 and Comparative Example 1).

TABLE 1

| | Film Thickness of $PbTiO_3$ (nm) | Average Diameter of Piezoelectric Body (nm) | Breakdown Voltage (V) |
|---|---|---|---|
| Embodiment 1 | 3 | 128 | 140.1 |
| Embodiment 2 | 7 | 134 | 137.8 |
| Embodiment 3 | 10 | 105 | 135.2 |
| Embodiment 4 | 20 | 90 | 137.1 |
| Embodiment 5 | 30 | 46 | 89 |
| Comparative Example 1 | 40 | 35 | 67 |

As illustrated in Table 1, the average particle diameter of the piezoelectric body correlates with the thickness of the $PbTiO_3$ layer. As the thickness of the $PbTiO_3$ layer increases, the average particle diameter is likely to decrease. It is assumed that the increase in the thickness of the $PbTiO_3$ layer causes the generation rate of crystal nuclei to increase at the time of PZT crystallization, thereby reducing the size of grains (crystal grains) of PZT. It is considered that the $PbTiO_3$ layer serves as a seed layer that promotes the formation of PZT nuclei, and the nucleation density changes depending on the film thickness of the $PbTiO_3$ layer. The PZT nuclei are nuclei of the PZT particles.

Table 1 also illustrates the relation between the average particle diameter of the piezoelectric body and the dielectric breakdown voltage. As the average particle diameter decreases, the dielectric breakdown voltage decreases. The current leakage is generally larger in the grain boundary portion than in the bulk portion of the grain. Therefore, it is considered that the proportion of the grain boundary in the PZT film increases due to the decrease of the grain size, and the leakage in the film thickness direction increases, so that the dielectric breakdown voltage is lowered.

When the dielectric breakdown voltage is lower than about 70V, a leak current may be generated when a voltage is applied to the piezoelectric body, thereby increasing the possibility of failure. Therefore, in consideration of Table 1, the average particle diameter of the piezoelectric body (average diameter of the particles of PZT) is preferably 40 nm or more to secure dielectric strength.

The $PbTiO_3$ layer preferably has a thickness of 3 nm or more. When the thickness of the $PbTiO_3$ layer is equal to or greater than 3 nm, the $PbTiO_3$ layer can function as the seed layer. In consideration of Table 1, the thickness of the PbTiO$_3$ layer is preferably equal to or less than 35 nm. When the thickness of the PbTiO$_3$ layer is equal to or less than 35 nm, the average particle diameter of the piezoelectric body can be reliably controlled to be equal to or greater than 40 nm.

In order to make the average particle diameter of the piezoelectric body equal to or greater than 40 nm, for example, as described above, the PbTiO$_3$ layer is provided to control the crystallization of PZT. In this case, the average particle diameter of the piezoelectric body can be controlled by adjusting the thickness of the PbTiO$_3$ layer.

In addition to the above-described method, a ratio of zirconium/titanium (Zr/Ti) of a PZT precursor in a sol-gel method may be controlled to make the average particle diameter of the piezoelectric body equal to or greater than 40 nm. For example, when the ratio of Zr/Ti is rich in Zr, the nucleation density can be further reduced, thereby increasing the grain size of PZT. For example, when the ratio of Zr/Ti of the PZT precursor in the sol-gel method is set to 63/37 and the PZT film is formed, the average particle diameter increases to about 600 nm (0.6 µm).

Figure 4:
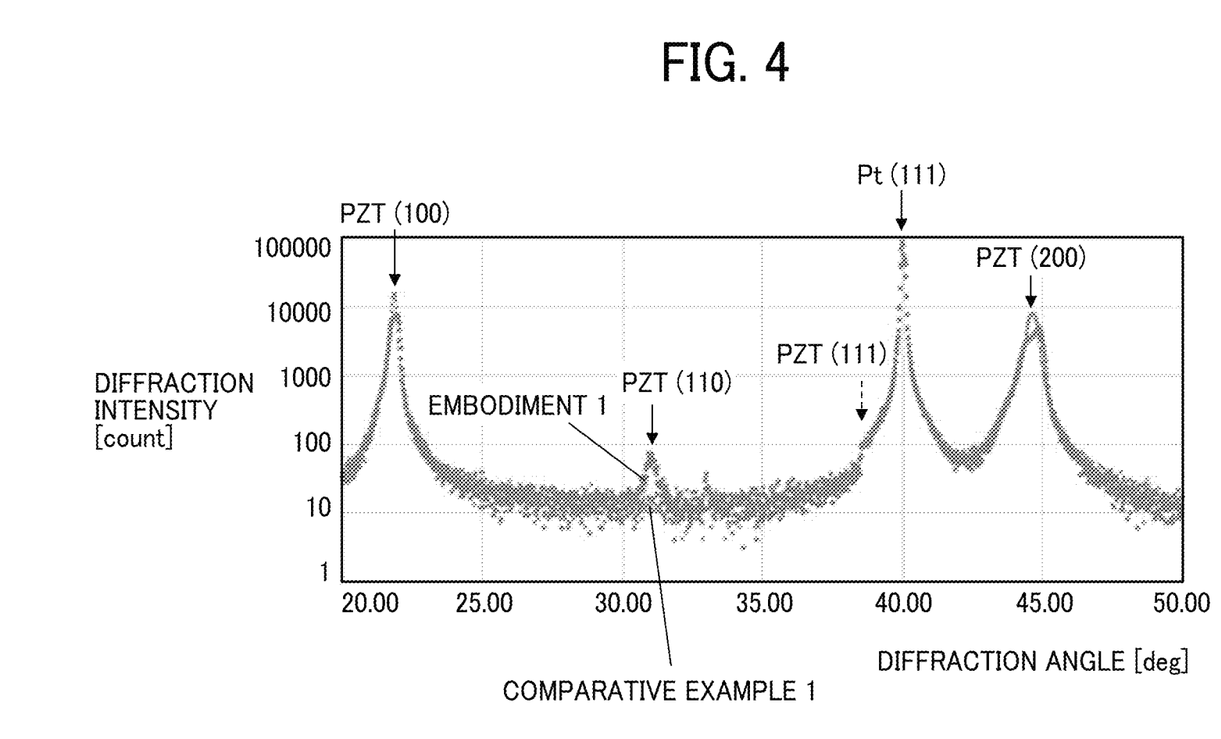
FIG. 4 is a graph illustrating an example of measurement results of 2θ values obtained by an X-ray diffraction θ-2θ method on the piezoelectric body (PZT film)

When the average particle diameter of the piezoelectric body is too large, PZT (110) is generated in the PZT film. Here, the number in parentheses indicates a plane orientation of crystal, and PZT (110) means PZT having (110) orientation. FIG. 4 is a graph illustrating an example of measurement results of 2θ values obtained by an X-ray diffraction θ-2θ method on the piezoelectric body (PZT film). In FIG. 4, measurement results of Embodiment 1 and Comparative Example 1 are illustrated.

PZT (110) is not generated in Comparative Example 1 in which the average particle diameter of the piezoelectric body is less than 40 nm. On the other hand, PZT (110) is generated in Embodiment 1 in which the average particle diameter of the piezoelectric body is 128 nm. Preferably, PZT having (100) orientation is used as an actuator. In view of the above, a description is given below of an acceptable level of the piezoelectric properties when the average particle diameter of the piezoelectric body is increased. The average particle diameter of the piezoelectric body (average diameter of the particles of PZT) is preferably 600 nm or less. When the average particle diameter is equal to or less than 600 nm, PZT can be oriented to (100) orientation while maintaining good dielectric strength.

In the X-ray diffraction θ-2θ method, attention is paid to the intensity of the filter of the measurement system. In FIG. 4, a position of PZT (111) indicated by the broken line arrow, which looks like a step, is caused by a filter of the measurement system. Therefore, although PZT (111) appears at the position in the graph, the peak of PZT (111) does not actually appear in the graph in FIG. 4.

In consideration of the dielectric strength and (100) orientation of PZT when the average particle size of the piezoelectric body is 40 nm or more, the following relation is preferable. In the piezoelectric body according to the present embodiment, preferably, an orientation intensity measured by an X-ray diffraction intensity method satisfies the following relation: (100) diffraction intensity/{(100) diffraction intensity+(111) diffraction intensity+(110) diffraction intensity}>0.8. Here, (100) diffraction intensity means a diffraction intensity of PZT (100). By satisfying this relation, PZT can be oriented to (100) orientation while maintaining good dielectric strength.

More preferably, the average particle diameter of the piezoelectric body (average diameter of the particles of PZT) is 40 nm or more and 180 nm or less, and in particular, 90 nm or more and 140 nm or less. Within these ranges, the dielectric strength can be further improved.

A method of manufacturing the liquid discharge head according to the present embodiment is described. Here, an example of manufacturing the liquid discharge head 150 illustrated in FIGS. 1 and 2 is described.

The liquid discharge head according to the present embodiment includes a nozzle from which liquid is discharged, a liquid chamber communicating with the nozzle, and an actuator to pressurize the liquid in the liquid chamber. The actuator is an actuator according to the present embodiment.

(a) The diaphragm 13 is formed as a film over a silicon single crystal substrate as the actuator substrate 100 (of a thickness of, for example, 400 µm) having (110) orientation. The diaphragm 13 may have a structure in which three layers of a silicon oxide film, a silicon nitride film, and an amorphous layer are laminated by, for example, a low-pressure chemical vapor deposition (LP-CVD) method.

The silicon oxide film preferably has compressive stress, and the silicon nitride film preferably has tensile stress. Each film thickness can be appropriately changed, and is determined so that the stress has a desired value, for example.

As the amorphous layer, for example, a silicon oxide film or alumina is preferably used, but the amorphous layer is not limited thereto. As the amorphous layer, it is preferable to select an appropriate material so as to trap lead (Pb) contained in PZT formed on the amorphous layer. In order to reliably prevent diffusion of Pb from PZT, the film thickness of the amorphous layer is preferably equal to or greater than 40 nm.

Then, for example, the common electrode 10 containing titanium dioxide (TiO$_2$) and platinum (Pt) is formed into films of 20 nm and 160 nm, respectively, by sputtering. In this example, the common electrode 10 corresponds to a lower electrode.

(b) Next, a precursor material is applied onto the common electrode 10 by, for example, spin coating in a plurality of times, and PZT is formed as the piezoelectric body 20 so as to have a final thickness of 2 µm.

The method of forming the piezoelectric body 20 is not limited to the sol-gel method using spin coating, and other methods such as a sputtering method, an ion plating method, an aerosol method, and an inkjet method can be used. Here, a method of film formation by the sol-gel method is described as an example. First, as a seed layer for controlling the orientation of PZT, a PbTiO$_3$ film is formed at approximately 7 nm by spin coating. The precursor material is then applied by, for example, spin coating to form the PZT precursor.

The precursor material can be appropriately changed as described above. For example, by adjusting the ratio of Zr/Ti, the grain size of PZT (diameter of the PZT particles) can be controlled. For example, the Zr/Ti ratio is preferably in the range of 47/53 to 63/37. Within this range, the average particle diameter of the piezoelectric body can be reliably controlled to 40 to 600 nm.

Next, the PZT precursor is heated. The temperatures relating to the heating may be appropriately changed. For example, the PZT precursor is heated at the drying temperature of 120° C., the pre-firing temperature of 380° C., and the main firing temperature of 700° C. in three separate steps.

Next, the piezoelectric body 20 and the individual electrode 11 are formed at a position corresponding to the pressure chamber 15 to be formed later by a lithography etching method. The piezoelectric body 20 and the individual electrode 11 are formed in consideration of the position of a bonding portion 48. As the individual electrode 11, for example, strontium ruthenium oxide (SRO) and Pt can be used. For example, an SRO film of 40 nm and a Pt film of 100 nm are formed by sputtering. In this example, the individual electrode 11 corresponds to an upper electrode.

(c) Next, the interlayer insulating film 45 is formed to insulate the common electrode 10 and the piezoelectric body 20 from the wiring layer 42 to be formed later. As the interlayer insulating film 45, a silicon dioxide ($SiO_2$) film of 1000 nm is formed by, for example, a plasma chemical vapor deposition (CVD) method. The interlayer insulating film 45 may be any other film than the $SiO_2$ film formed by the plasma CVD method as long as the film does not affect the piezoelectric body 20 and the electrode materials and has insulating properties.

Next, a connection hole that connects the individual electrode 11 and the wiring layer 42 is formed by the lithography etching method. When the common electrode 10 is also connected to the wiring layer 42, a connection hole is similarly formed.

(d) Next, as the wiring layer 42, for example, titanium nitride (TiN) and aluminum (Al), respectively, are formed into a film having a thickness of 30 nm and a film having a thickness of 3 μm by sputtering. TiN can be used as a barrier layer for preventing Pt from being alloyed when Pt is used as the material of the individual electrode 11 or the common electrode 10 at the bottom of the connection hole. In the case in which Pt is used as the material of the individual electrode 11 or the common electrode 10, when Pt is in direct contact with Al that is the material of the wiring layer 42, Pt may be alloyed by heat history in a subsequent step. In this case, film peeling or the like may occur due to stress caused by volume change. However, use of TiN can prevent the film peeling or the like.

Next, the wiring layer 42 is also formed on a portion that is to be the bonding portion 48 with the support substrate 200 later.

(e) Next, as a passivation film 50, a silicon nitride film is formed with a thickness of 1000 nm by, for example, the plasma CVD method.

(f) Next, a lead wiring pad portion 41 of the wiring layer 42, a portion corresponding to the piezoelectric body 20, and the common liquid supply passage 19 are opened by the lithography etching method.

(g) Next, portions of the diaphragm 13 corresponding to the common liquid supply passage 19 and the common liquid chamber 18 to be formed are removed by the lithography etching method.

(h) Next, a counterbore 67 is formed at a position corresponding to the piezoelectric body 20 by the lithography etching method, thereby manufacturing the support substrate 200 in which the bonding portion 48 is formed. At this time, silicon processing is performed by a dry etching method or the like.

Next, the support substrate 200 and the actuator substrate 100 are bonded by adhesive 49 via the bonding portion 48. The adhesive 49 is applied to a thickness of about 1 μm on the support substrate 200 by, e.g., a general thin-film transfer apparatus.

Next, in order to form the pressure chamber 15, the common liquid chamber 18, and the fluid restrictor 17, the actuator substrate 100 is polished so as to have a desired thickness t (for example, a thickness of 80 μm). Instead of the polishing method, etching or the like may be used.

(i) Next, partition portions other than the pressure chamber 15, the common liquid chamber 18, and the fluid restrictor 17 are coated with a resist by a lithography method. Next, anisotropic wet etching is performed using an alkali solution (for example, a potassium hydroxide (KOH) solution or a tetramethylammonium hydroxide (TMHA) solution) to form the pressure chamber 15, the common liquid chamber 18, and the fluid restrictor 17. The pressure chamber 15, the common liquid chamber 18, and the fluid restrictor 17 may be formed by dry etching using an inductively coupled plasma (ICP) etcher instead of anisotropic etching using an alkali solution.

(j) Next, the nozzle substrate 300 separately formed, in which the nozzle orifices 16 are opened at positions corresponding to the pressure chambers 15, are bonded to form a liquid discharge head 150.

Next, a liquid discharge apparatus according to the present embodiment is described. The liquid discharge apparatus according to the present embodiment includes a liquid container to contain liquid, the liquid discharge head according to the present embodiment to discharge the liquid, a carriage on which the liquid discharge head is mounted, and a main scanning moving mechanism to move the carriage in a main scanning direction.

Figure 5:
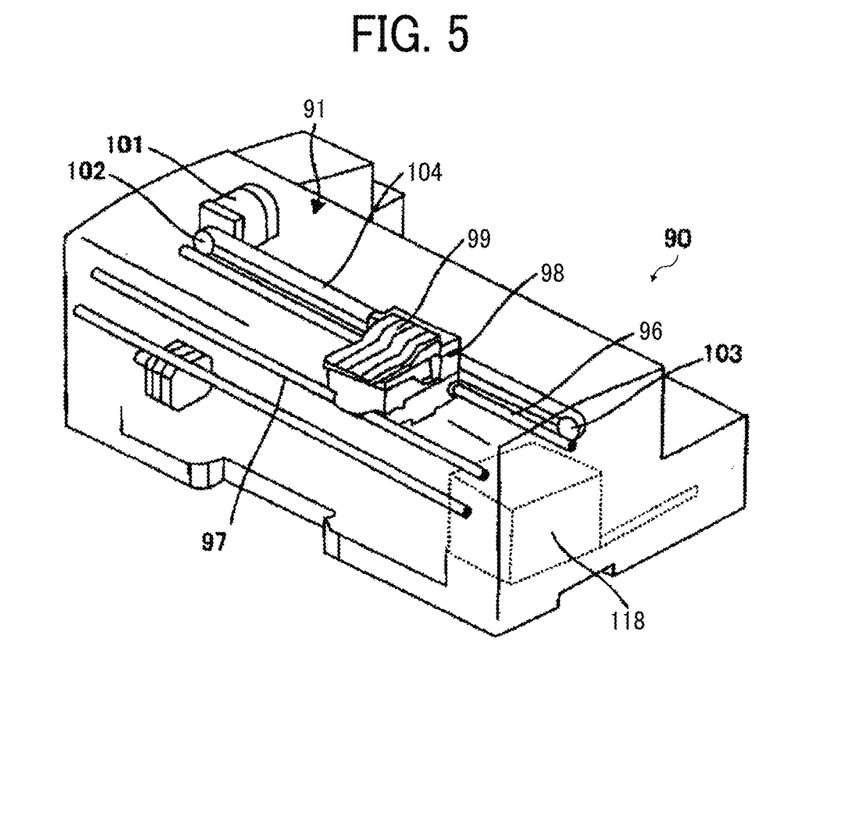
FIG. 5 is a schematic perspective view of a liquid discharge apparatus according to embodiments of the present disclosure.
Figure 6:
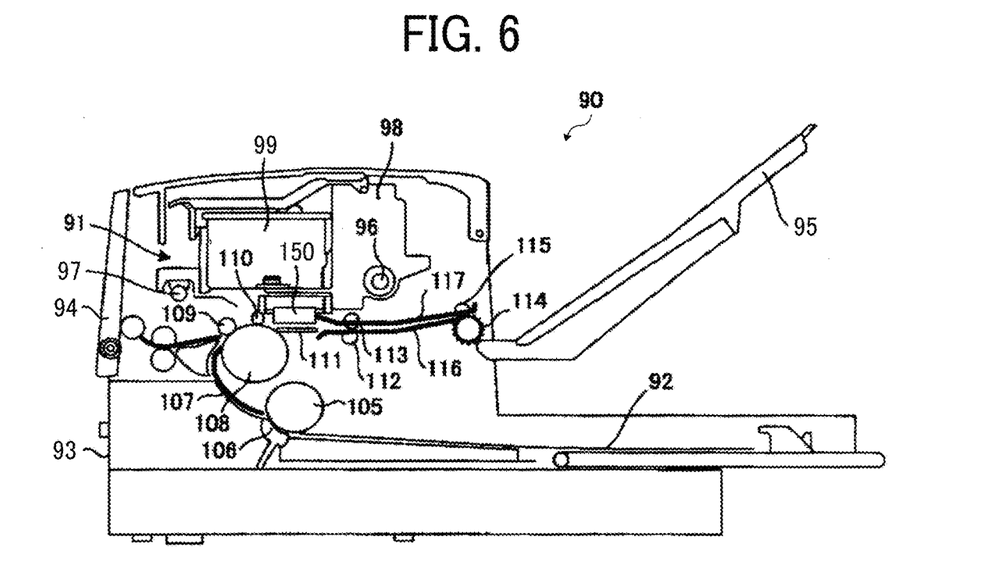
FIG. 6 is a schematic side view of the liquid discharge apparatus according to embodiments of the present disclosure.

FIGS. 5 and 6 illustrate the liquid discharge apparatus according to the present embodiment. In the present embodiment, an inkjet recording apparatus 90 is described as an example of the liquid discharge apparatus.

The inkjet recording apparatus 90 houses a printing mechanism unit 91. The printing mechanism unit 91 includes a carriage 98 movable in the main scanning direction, the liquid discharge head 150 mounted on the carriage 98, an ink cartridge 99 as a liquid container to supply ink to the liquid discharge head 150, and the like inside an apparatus body. A sheet feeding cassette (or a sheet tray) 93 is removably installed in a lower portion of the apparatus body. A large number of sheets 92 can be loaded in the sheet feeding cassette 93 from the front side of the apparatus body.

The inkjet recording apparatus 90 includes a bypass tray (or manual feed tray) 94 that is openable. An operator loads the sheet 92 on the opened bypass tray 94 to feed the sheet 92. The inkjet recording apparatus 90 takes in the sheet 92 fed from the sheet feeding cassette 93 or the bypass tray 94, records a desired image on the sheet 92 by the printing mechanism unit 91, and ejects the sheet 92 to an output tray 95 attached to the rear side of the apparatus body.

In the printing mechanism unit 91, a main guide rod 96 and a sub-guide rod 97 serving as guides laterally bridged between a left side plate and a right side plate support the carriage 98 slidably in the main scanning direction. The liquid discharge heads 150 to discharge ink droplets of different colors of yellow (Y), cyan (C), magenta (M), and black (Bk) are mounted on the carriage 98 so that a plurality of ink discharge ports (nozzles) of each nozzle row is arranged in a direction intersecting the main scanning direction. The liquid discharge heads 150 are mounted on the carriage 98 in such a direction that ink droplets are discharged downward. The ink cartridges 99 to supply the respective color inks to the liquid discharge heads 150 are replaceably mounted on the carriage 98.

The ink cartridge 99 has an atmospheric port communicating with the ambient atmosphere at the upper side of the ink cartridge 99 and has a supply port to supply ink to the corresponding liquid discharge head 150 at the lower side of the ink cartridge 99. The ink cartridge 99 includes a porous body filled with ink, and the ink to be supplied to the liquid discharge head 150 is maintained at a slight negative pressure by the capillary force of the porous body.

In the present embodiment, the liquid discharge heads 150 discharge ink droplets of respective colors. Note that, in some embodiments, a single liquid discharge head that includes nozzles to discharge ink droplets of different colors may be used.

In the present embodiment, the rear side (the downstream side in a sheet conveyance direction) of the carriage 98 is slidably fitted onto the main guide rod 96, and the front side (the upstream side in the sheet conveyance direction) of the carriage 98 is slidably mounted onto the sub-guide rod 97. In order to move the carriage 98 in the main scanning direction, a timing belt 104 is stretched between a drive pulley 102 rotationally driven by a main scanning motor 101 and a driven pulley 103, thereby constructing the main scanning moving mechanism. The timing belt 104 is secured to the carriage 98, and the carriage 98 is reciprocated by forward rotation and reverse rotation of the main scanning motor 101.

A sheet feeding roller 105 and a friction pad 106 that separate and feed the sheet 92 from the sheet feeding cassette 93 are provided to convey the sheet 92 set in the sheet feeding cassette 93 to the lower side of the liquid discharge head 150. The inkjet recording apparatus 90 further includes a guide member 107 to guide the sheet 92, a conveyance roller 108 to turn and convey the fed sheet 92, a conveyance roller 109 pressed against the circumferential surface of the conveyance roller 108, and a leading end roller 110 to define the feed angle of the sheet 92 from the conveyance roller 108. The conveyance roller 108 is rotationally driven by a sub-scanning motor via a gear train.

The inkjet recording apparatus 90 further includes a print receiver 111 disposed below the liquid discharge heads 150. The print receiver 111 is a sheet guide to guide the sheet 92, which is fed from the conveyance roller 108, in a range corresponding to a range of movement of the carriage 98 in the main scanning direction.

A conveyance roller 112 and a spur roller 113 are disposed on the downstream side of the print receiver 111 in the sheet conveyance direction. The conveyance roller 112 is driven to rotate so as to feed the sheet 92 in a sheet ejection direction. The inkjet recording apparatus 90 further includes a sheet ejection roller 114 and a spur roller 115 to feed the sheet 92 to the output tray 95 and guides 116 and 117 that define a sheet ejection passage.

When the inkjet recording apparatus 90 performs recording, the inkjet recording apparatus 90 drives the liquid discharge heads 150 in response to an image signal while moving the carriage 98. As a result, ink is discharged onto the sheet 92 not in motion to record one line of an image. Next, after the sheet 92 is conveyed by a predetermined distance, the next line is recorded thereon.

In response to a recording end signal or a signal indicating that the trailing end of the sheet 92 has reached a recording area, the inkjet recording apparatus 90 ends the recording operation and ejects the sheet 92.

The inkjet recording apparatus 90 further includes a recovery device 118 to recover the liquid discharge heads 150 from a discharge failure. The recovery device 118 is disposed at a position outside the recording area at the right end in FIG. 5 in a movement direction of the carriage 98. The recovery device 118 includes a cap unit, a suction unit, and a cleaning unit. In a printing standby state, the carriage 98 is placed at the side at which the recovery device 118 is disposed and the liquid discharge heads 150 are capped with the cap unit. Accordingly, the ink discharge ports are maintained in a wet state, thus preventing the discharge failure due to ink drying. In addition, during recording, the inkjet recording apparatus 90 discharges ink not relating to the recording to maintain the viscosity of ink in all of the ink discharge ports constant, thus maintaining a stable discharge state.

When the discharge failure occurs, the ink discharge ports (nozzles) of the liquid discharge heads 150 are sealed with the cap unit, and bubbles along with ink are sucked from the ink discharge ports by the suction unit through a tube. The cleaning unit removes ink and dust adhered to a discharge port face, thus recovering the liquid discharge head 150 from the discharge failure. The sucked ink is drained to a waste ink container disposed at a lower portion of the apparatus body, and is absorbed into and retained in an ink absorber in the waste ink container.

As described above, the inkjet recording apparatus 90 mounts the liquid discharge head according to the present embodiment. Thus, stable ink discharge characteristics are obtained, thereby improving image quality. Note that the example in which a liquid discharge head is used in the inkjet recording apparatus 90 has been described above. In some embodiments, for example, the liquid discharge head may be applied to an apparatus that discharges droplets other than ink, for example, a liquid resist for patterning.

As described above, according to the present disclosure, an actuator having good dielectric strength and high reliability can be provided.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

What is claimed is:

1. An actuator comprising:
   a substrate;
   a diaphragm over the substrate;
   a lower electrode over the diaphragm;
   a lead titanate ($PbTiO_3$) layer over the lower electrode;
   a piezoelectric body over the $PbTiO_3$ layer, the piezoelectric body comprising particles of lead zirconate titanate (PZT); and
   an upper electrode over the piezoelectric body,
   wherein an average diameter of the particles of the PZT is 40 or more, where the average diameter is measured by capturing an electron backscatter diffraction image of the piezoelectric body in an image area of 20 μm×20 μm, fitting each of the particles in the image area to a circle, and determining an average value of diameters of the circles, and
   the $PbTiO_3$ layer has a thickness of 3 nm or more and 35 nm or less.

2. The actuator according to claim 1, wherein the lower electrode comprises platinum.

3. The actuator according to claim 1, wherein the piezoelectric body satisfies the following relation:

(100)diffraction intensity/{(100)diffraction intensity+ (111)diffraction intensity+(110)diffraction intensity}>0.8, in measuring orientation intensity by an X-ray diffraction intensity method.

4. The actuator according to claim 1, wherein the particles of the PZT have an average diameter of 600 nm or less.

5. The actuator according to claim 1,
wherein the particles of the PZT have an average diameter of 180 nm or less.

6. The actuator according to claim 1,
wherein the particles of the PZT have an average diameter of 90 nm or more and 140 nm or less.

7. A liquid discharge head comprising:
a nozzle from which a liquid is discharged;
a liquid chamber communicating with the nozzle; and
the actuator according to claim 1, configured to pressurize the liquid in the liquid chamber.

8. A liquid discharge apparatus comprising:
a liquid container configured to contain a liquid;
the liquid discharge head according to claim 7, configured to discharge the liquid;
a carriage on which the liquid discharge head is mounted; and
a main scanning moving mechanism configured to move the carriage in a main scanning direction.

9. The actuator according to claim 1, wherein the average diameter of the particles of the PZT is 90 nm or more and 180 nm or less, where the average diameter is measured by capturing the electron backscatter diffraction image of the piezoelectric body in the image area of 20 µm×20 µm, fitting each of the particles in the image area to the circle, and determining the average value of diameters of the circles.

* * * * *